(12) United States Patent
Ghoshal

(10) Patent No.: US 9,376,214 B2
(45) Date of Patent: Jun. 28, 2016

(54) HYBRID PROPULSION POWER SYSTEM FOR AERIAL VEHICLES

(71) Applicant: Reebeez, Inc., Austin, TX (US)

(72) Inventor: Ankita Ghoshal, Austin, TX (US)

(73) Assignee: Reebeez, Inc., Austin, TX (US)

( * ) Notice: Subject to any disclaimer, the term of this patent is extended or adjusted under 35 U.S.C. 154(b) by 0 days.

(21) Appl. No.: 14/867,152

(22) Filed: Sep. 28, 2015

(65) Prior Publication Data

US 2016/0090184 A1 Mar. 31, 2016

Related U.S. Application Data

(60) Provisional application No. 62/056,554, filed on Sep. 28, 2014.

(51) Int. Cl.

| H01L 35/00 | (2006.01) |
|---|---|
| H01L 35/12 | (2006.01) |
| H01L 35/28 | (2006.01) |
| H01L 35/30 | (2006.01) |
| H01L 35/32 | (2006.01) |
| H02S 10/30 | (2014.01) |
| B64D 27/24 | (2006.01) |
| B64C 39/02 | (2006.01) |
| H02P 31/00 | (2006.01) |

(52) U.S. Cl.
CPC .............. *B64D 27/24* (2013.01); *B64C 39/024* (2013.01); *H01L 35/00* (2013.01); *H01L 35/12* (2013.01); *H01L 35/28* (2013.01); *H01L 35/30* (2013.01); *H01L 35/32* (2013.01); *H02P 31/00* (2013.01); *H02S 10/30* (2014.12); *B64C 2201/042* (2013.01); *H02P 2201/07* (2013.01)

(58) Field of Classification Search
CPC ......... H01L 35/00; H01L 35/12; H01L 35/28; H01L 35/30; H01L 35/32; H02S 10/30
See application file for complete search history.

(56) References Cited

U.S. PATENT DOCUMENTS

| 2011/0284059 A1* | 11/2011 | Celanovic | H02S 10/30 136/253 |
|---|---|---|---|
| 2012/0031067 A1* | 2/2012 | Sundaram | F01D 25/30 60/39.01 |
| 2014/0345281 A1* | 11/2014 | Galbraith | B60K 6/24 60/716 |
| 2015/0083180 A1* | 3/2015 | Lang | H01L 35/30 136/207 |
| 2015/0207450 A1* | 7/2015 | Holzner | H02S 10/30 136/253 |

* cited by examiner

*Primary Examiner* — William H Rodriguez
*Assistant Examiner* — William Breazeal
(74) *Attorney, Agent, or Firm* — Atlas Intellectual Property Law; Travis Banta

(57) ABSTRACT

This disclosure generally relates to a hybrid solid-state propulsion system for aerial vehicles. The hybrid propulsion system includes a combustor, a thermophotovoltaic generator, and a thermoelectric generator. The combustor burns a chemical based fuel to produce radiation and heat that are converted into electricity used to power the aerial vehicle. The thermophotovoltaic generator is positioned to receive radiation and remnant heat generated by flames in the combustor while the thermoelectric generator receives heat from exhausted flue gases from the combustor.

11 Claims, 5 Drawing Sheets

HYBRID PROPULSION POWER SYSTEM FOR AERIAL VEHICLES

PRIORITY CLAIM

This application claims priority to U.S. Provisional Application No. 62/056,554, filed on Sep. 28, 2014, which is herein incorporated by reference in its entirety.

BACKGROUND

1. Technical Field

This disclosure relates to a hybrid propulsion system for an unmanned vehicle. More specifically, the hybrid propulsion system disclosed herein provides a propulsion system for an aerial craft, such as a drone or a UAV (unmanned aerial vehicle), which uses solid-state engines to convert energy from chemical based fuel into electricity used to control flight operations the craft.

2. Description of the Related Art

Conventional airplanes, helicopters, and other flying craft have been relied on jet engines or internal combustion engines to create the thrust necessary for powered flight. These large aerial vehicles have transformed the world by flying cargo and passengers from one place to another. However, these large aerial vehicles require substantial amounts of fuel in order to produce the thrust necessary to take off and maintain flight.

More recently, unmanned craft have begun taking on flight roles traditionally performed by manned craft. For example, UAVs or drones are used by militaries today to perform reconnaissance, launch weapons, or monitor battle situations without exposing the operator to risk. At the same time, UAVs and drones have been used by hobbyists, cartographers, photographers, civil engineers, treasure hunters, and a host of other professional and amateur operators to provide a point of view of a particular area or object that would be prohibitively expensive to obtain by a manned craft, such as an airplane or a helicopter.

In virtually every situation, a more lightweight aerial vehicle is desirable over a heavier aerial vehicle because lighter aerial vehicles require less thrust to achieve flight, all other considerations being equal. Since the amount of thrust produced is directly proportional to the energy expended, the lightest aerial vehicle that will perform a particular task is typically best. Since the weight of a propulsion system is a significant fraction (20-40%) of the total weight of a UAV, it is desirable that the propulsion system weigh as little as possible. Further, it is desirable for the UAV fuel or energy storage device to have a high specific energy content, or in other words, a high energy output to mass ratio. Further, the less energy that is expended for propulsion of an UAV from chemical based fuels or electricity, the longer an aerial vehicle can maintain flight and the farther the aerial vehicle can travel without refueling.

Engines derive energy from the heat of combustion of chemical fuels such as hydrocarbons (natural gas, butane, and gasoline) or hydrogen. The specific energy of hydrocarbon fuels (say, butane) is 45 MJ/kg (12.5 kWh/kg), and that of hydrogen is 140 MJ/kg (38.9 kWh/kg). Specific energy of chemical fuels are about hundred times greater than state-of-the-art battery technologies. Lithium polymer (LiPo) batteries, which are commonly used in drones, have low specific energies (<0.17 kWh/kg). However, engines such as jet engines and internal combustion engines, utilized to convert energy in chemical fuels to propeller power are heavy and cannot be scaled down in size because of poor reliability and high cost of manufacturing.

In order to reduce weight, many UAVs and drones use batteries to provide the power necessary to create sufficient thrust for flight. However, batteries are also subject to a host of limitations. For example, although advanced batteries such as lithium-ion, lithium polymer, and other batteries provide power suitable to create enough thrust for a UAV or a drone to fly, batteries in general are expensive, have low specific energies, low power densities, short cycle lives, long charging times, are sensitive to adverse weather and humidity conditions, can be toxic, and, in many cases, have a generally adverse effect on the environment in terms of manufacture and disposal. Many UAV and drone operators find that these limitations limit their ability to use or their enjoyment in using and operating a UAV or drone. Further, these limitations provide powered flight for a disappointingly short amount of time, even with very small, often inadequate payloads.

Accordingly, it is one object of this disclosure to provide hybrid solid-state, lightweight, and robust propulsion power system for aerial vehicles such as UAVs and drones. It is another object of this disclosure to overcome the limitations of conventional battery technology while providing thrust to an aerial vehicle by means of electric power. It is another object of this disclosure to enhance a UAV or drone operator's flight experience by providing a propulsion system that increases flight time.

It is a further object of this disclosure to provide a propulsion system that does not rely on electrical power provided from an electrical grid. Yet another object of this disclosure is to increase the payload capacity of a drone that operates by means of electrical power.

SUMMARY

Disclosed herein is a hybrid solid-state propulsion power system. The hybrid solid-state propulsion system includes a combustor, a thermophotovoltaic generator, and a thermoelectric generator. The combustor produces heat and radiation, which are converted by the thermoelectric generator and the thermophotovoltaic generator into electricity used for propulsion.

Also disclosed herein is a UAV that includes a combustor, a thermophotovoltaic generator, and a thermoelectric generator. The thermophotovoltaic generator converts radiation and heat from the combustor to visible or infrared light and then converts the light to electricity using one or more photovoltaic cells. The thermoelectric generator generates electricity from heat received from conduction and convective flue gases exhausted by the combustor. The generated electricity provides power to propel the UAV through the air.

BRIEF DESCRIPTION OF THE DRAWINGS

The accompanying drawings illustrate an embodiment of a hybrid solid-state propulsion power system for aerial vehicles.

DETAILED DESCRIPTION OF PREFERRED EMBODIMENTS

In the following description, for purposes of explanation and not limitation, specific techniques and embodiments are set forth, such as particular techniques and configurations, in order to provide a thorough understanding of the device disclosed herein. While the techniques and embodiments will primarily be described in context with the accompanying drawings, those skilled in the art will further appreciate that the techniques and embodiments may also be practiced in other similar devices.

Reference will now be made in detail to the exemplary embodiments, examples of which are illustrated in the accompanying drawings. Wherever possible, the same reference numbers are used throughout the drawings to refer to the same or like parts. It is further noted that elements disclosed with respect to particular embodiments are not restricted to only those embodiments in which they are described. For example, an element described in reference to one embodiment or figure, may be alternatively included in another embodiment or figure regardless of whether or not those elements are shown or described in another embodiment or figure. In other words, elements in the figures may be interchangeable between various embodiments disclosed herein, whether shown or not.

Figure 1:
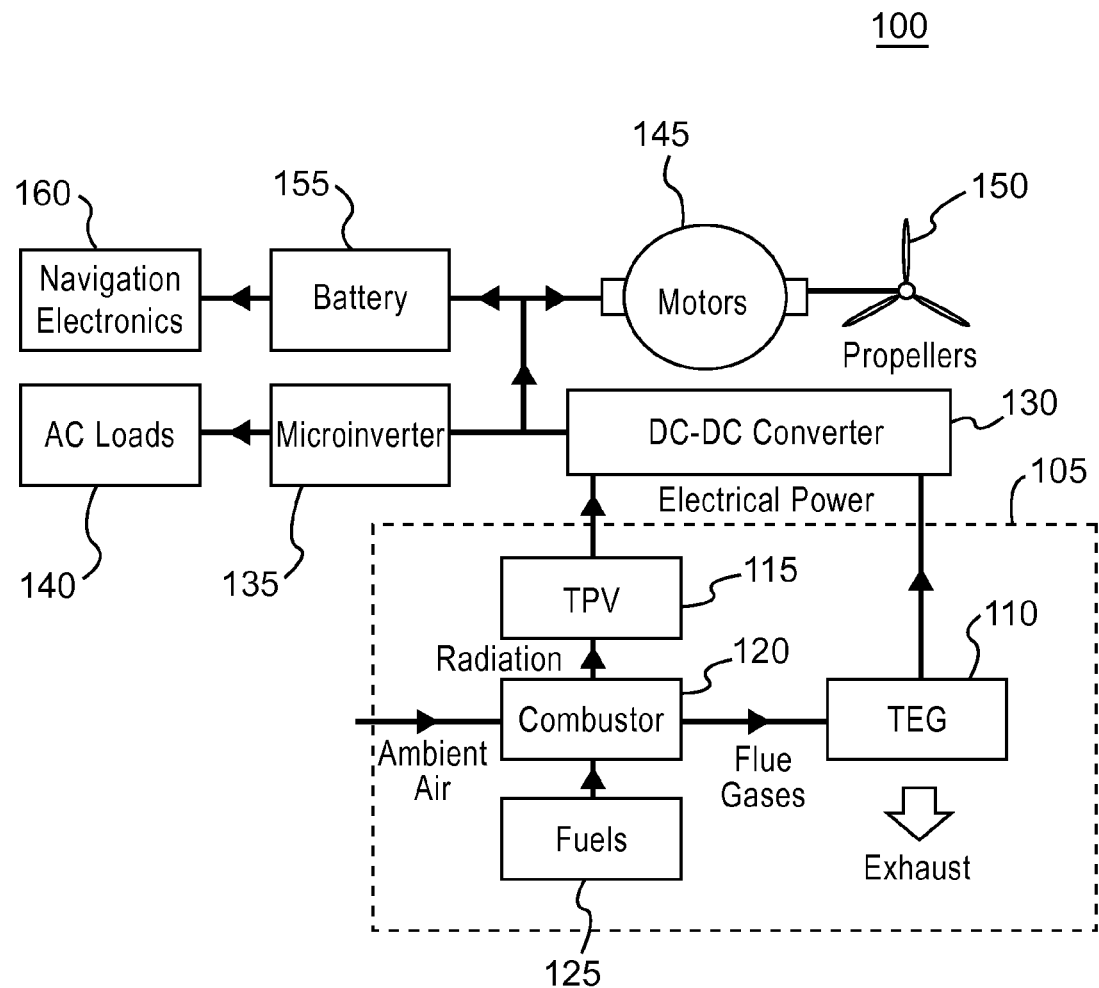
FIG. 1 illustrates a block diagram of an aerial vehicle, which incorporates a hybrid solid-state propulsion power system.

FIG. 1 illustrates a block diagram of an aerial vehicle 100, which incorporates a hybrid propulsion power system 105. Aerial vehicle 100 may be implemented as a UAV (unmanned aerial vehicle) which may be more commonly referred to as a drone. Aerial vehicle 100 is an unmanned flying craft, the flight controls of which are typically managed by a wireless communication connection between a ground-based controller operating an aerial vehicle control device and aerial vehicle 100. Hosts of wireless communication connections may be established between the aerial control device and aerial vehicle 100, both secured (encrypted) and unsecured (unencrypted). Aerial vehicle 100 includes a hybrid propulsion power system 105 in order to provide power to create the thrust required for powered flight of aerial vehicle 100. In this embodiment, hybrid propulsion power system 105 includes a thermoelectric generator ("TEG") 110 and a thermophotovoltaic generator ("TPV") 115. TEG 110 is a device, which is explained in more detail below, which converts heat into electricity by electronic transport. TPV 115 is a device, which will also be explained in more detail below, which converts radiation and heat into visible and infrared light and then converts the light into electricity using photovoltaic cells. The term "photovoltaic" as used herein refers to electrical devices that convert light into electricity, much like a conventional solar panel. In hybrid propulsion power system 105, ambient air may be drawn into a combustor 120 to facilitate combustion of chemical based fuel contained within a fuel tank 125.

Fuel tank 125 may contain any chemical based fuel suitable for use with hybrid propulsion power system 105. For example, chemical based fuels suitable for use with hybrid propulsion power system 105 include natural gas, butane, gasoline, hydrogen, methane, propane, any other liquid or gaseous hydrocarbon, carbon monoxide, ethanol, kerosene, and any mixture or combination of these fuels in any proportion. As fuel from fuel tank 105 is released at high pressure into combustor 120, air is entrained such that the air/fuel mixture is completely or nearly completely combusted. The product of this combustion is radiation and remnant heat, generated by flames as the fuel is burned and hot gas exhausted (air and combustion products such as carbon dioxide and steam), also referred to as flue gases. The flue gases are exhausted into TEG 110 while radiation and remnant heat generated within combustor 120 is transferred into TPV 115. TEG 110 generates DC (direct current) electricity from the heat in the flue gases exhausted by combustor 120. TPV 115 generates DC electricity from radiation and remnant heat within combustor 120 by first converting the radiation into visible and infrared light and then generating electricity using photovoltaic cells within TPV 115. In one embodiment, combustor 120 may further implement a recuperator, not shown, to harvest heat that may otherwise be wasted and preheat the entrained air entering the combustor to increase the overall efficiency of hybrid propulsion power system 105.

DC electricity generated by TEG 110 and TPV 115 is provided into a DC-DC converter 130 (direct current to direct current converter). DC-DC converter 130 acts as a transformer to either reduce or increase the voltage received from TEG 110 and TPV 115. In one embodiment, one or more motors 145 may operate at a voltage higher than the voltage level supplied by TEG 110 and TPV 115, in which case DC-DC converter 130 increases the voltage level by reducing the overall electrical current supply according to known electrical principles. Similarly, one or more motors 145 that operate at a voltage lower than the voltage level supplied by TEG 110 and TPV 115 are supplied by DC-DC converter 130 with voltage that is lower than the voltage level supplied by TEG 110 and TPV 115 by increasing the overall electrical current supply according to known electrical principles. DC-DC converter 130 is connected to microinverter 135, battery 155, and one or more motors 145 and supplies DC electricity at a particular voltage to one or more of microinverter 135, battery 155, and one or more motors 145.

In one embodiment, a microinverter 135 may be provided to transform direct current electricity into alternating current ("AC") electricity for AC loads 140. For example, if aerial vehicle 100 carried a payload that required cooling, an AC load 140 may implement a cooling device to cool the payload. Any device that requires alternating current for electricity may be implemented as AC load 140 and supplied with AC electricity through microinverter 135.

Battery 155 may be used to supply electricity to navigation and control electronics 160. Navigation and control electronics 160 interact with the aerial vehicle control device operated by a ground-based controller to provide flight control to the ground-based controller. Controls in the aerial control device may include throttle control of one or more motors, pitch, yaw, and thrust angles of aerial vehicle 100. Other control may be exerted by automation. For example, a smart drone may have the ability to receive and interpret global positioning information (GPS) from satellites and fly between two or more points autonomously.

Battery 155 may further store enough electricity to provide a ground-based controller with enough time to safely land aerial vehicle 100 in the event of an emergency. For example, if the fuel supply within fuel tank 125 became depleted by use, battery 155 may provide power to motors 145 to allow a ground based controller to safely land aerial vehicle 100 without damage. Other emergencies include technical failures, clogged or malfunctioning entrainment devices, tainted fuel conditions, and a host of other examples.

One or more motors 145 receive electricity from DC-DC converter 130 or battery 155. The one or more motors 145 may include thrust devices 150 that spin at high speed to produce lift and thrust for aerial vehicle 100. In many embodiments, thrust device 150 will be implemented as a propeller.

However, other thrust devices may be possible using jet based technologies or other technologies that direct air in a particular direction to produce thrust or lift.

Figure 2:
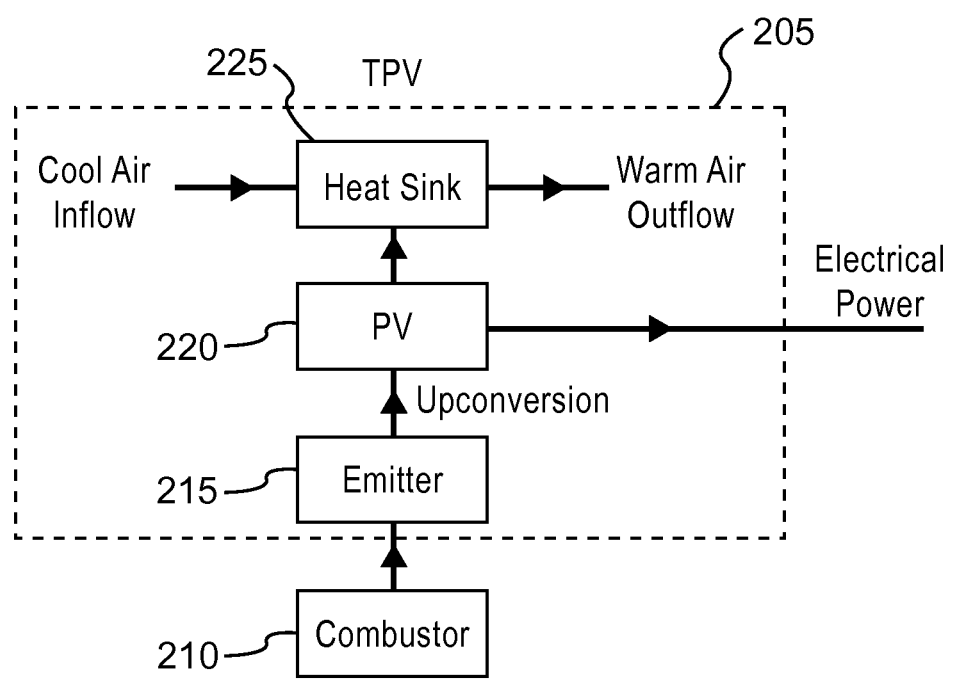
FIG. 2 illustrates a thermophotovoltaic electrical generator of a propulsion power system.

FIG. 2 illustrates a thermophotovaltaic electrical generator 205 ("TPV 205") used in propulsion power system 200. Propulsion power system 200 includes a combustor 210 that functions in a manner similar to that discussed above with respect to combustor 120 in FIG. 1. TPV 205 includes an emitter, 215, one or more photovoltaic cells 220, and a heat sink 225. In general, TPV 205 converts radiation emitted from one or more flames and remnant heat in the combustor into electrical energy. When the emitter 215 is heated by the radiation and remnant heat, emitter 215 emits low wavelength visible or near infrared light that can be converted to electricity by photovoltaic cells 220. Heat sink 225 maintains the photovoltaic cells 220 at an ambient temperature to maximize the efficiency of conversion of the radiation into electricity.

Combustor 210 releases fuel at high pressure through nozzles that entrain air with the fuel. In other words, combustor 210 mixes fuel with air to create a combustible gas. Alternatively, combustor 210 can be supplied with a pre-mixed oxygen-rich fuel to promote complete combustion of the fuel and therefore obtaining the most efficient (brightest and/or hottest) flame available. As fuel is burned within combustor 210, the flames in combustor 210 may create heat at a temperature in excess of 1500° C., and potentially up to 2500° C.

Emitter 215 is implemented using refractory metals such as Molybdenum (Mo), Niobium (Nb), Tantalum (Ta), or Tungsten (W). These refractory metals may be fashioned into a metal mesh, a metal foil, or implemented as photonic crystals and may be layered with rare earth element oxides such as Ytterbia ($Yb_2O_3$) and Erbia ($Er_2O_3$); semiconductors such as Silicon Carbide (SiC), or Molybdenum Disilicide ($MoSi_2$); metamaterials made of rare earth element oxides, platinum group elements on the Periodic Table of Elements; and other refractory metals. Whether implemented as a mesh or photonic crystals, emitter 215 is fashioned as an optical nanostructure that selectively affects the motion of photons in light. Accordingly, emitter 215 is a "tuned" upconverter amplifier, in a manner of speaking, that actively transforms the broadband radiation and long wavelength infrared light emitted from the flame within combustor 210 to shorter wavelength visible light and near infrared light. The emission spectra of the emitter 215 is dominated by visible light wavelengths that are matched to the radiation absorption characteristics of one or more photovoltaic cells 220. In one embodiment with rare earth element oxide emitters, emitted light with a frequency in the range of 500 nm-1000 nm is preferable for exposure to one or more Silicon (Si) or Gallium Antimonide (GaAs) photovoltaic cells 220, with a visible light wavelength of approximately 750 nm being ideal. In another embodiment with refractory metals, emitted light with a frequency in the range of 1000 nm-1500 nm is preferable for exposure to one or more Gallium Antimonide (GaSb) photovoltaic cells 220. In order to further enhance the efficiency of the emitter, thin films of platinum may be implemented as a reflector material that serves to reflect very long wavelength radiation back into combustor 210. Thus, emitter 215 transforms radiation from combustor 210 to shorter wavelength light such that the quantum efficiency of conversion from photons to electrons is maximized for one or more photovoltaic cells 220.

This process, of selectively transforming broadband long wavelength radiation with emitter 215, may be referred to as an upconversion because only light of a higher frequency (and therefore smaller wavelength) is emitted through the mesh or photonic crystals in emitter 215 to stimulate the production of electricity in one or more photovoltaic cells 220. Frequency upconversion for radiation from combustor 210 is desirable because the quantum efficiency of converting photons to electrons by one or more photovoltaic cells 220 is substantially increased, increasing the efficiency of the one or more photovoltaic cells 220. More simply put, emitter 215 acts as an intensity magnifier by emitting portions of light that are most efficient for conversion into electricity by one or more photovoltaic cells 220 based on the radiation received from combustor 210.

One or more photovoltaic cells 220 within TPV 205 are typically made of semiconductors that include Silicon (Si), Gallium Antimonide (GaSb), or InGaAsSb (a molecule comprising Indium, Gallium, Arsenic, and Antimony) or multi-junction photovoltaic cells such as the two junction Aluminum Gallium Indium Phosphide (AlInGaP) and Gallium Arsenide (GaAs) solar cells. One or more photovoltaic cells 220 convert light emitted by emitter 215 into electrical energy as electricity. Because the temperature of the combustor is fairly high, the one or more photovoltaic cells 220 may be thermally isolated from heat that may be transferred into or through emitter 215 by the use of a sapphire wafer and/or silica aerogels. Both sapphire wafers and silica aerogels allow shorter wavelength visible light emitted by emitter 215 to pass through unimpeded to the one or more photovoltaic cells 220 while at the same time reducing the transmission of heat to the one or more photovoltaic cells 220. However, at the same time, heat is created when the one or more photovoltaic cells 220 create electricity from received light. Accordingly, a heat sink 225 is provided to dissipate heat created by the one or more photovoltaic cells 220. Heat sink 225 provides a heat exchanger that allows cool ambient air to flow through a series of metal fins, which carry heat away from TPV 205. Heat sink 225 may be further implemented using fluidic cooling system and/or heat pipes. The use of sapphire wafers, silica aerogels, and heat sinks will further be explained with respect to FIG. 4 and FIG. 5.

Figure 3:
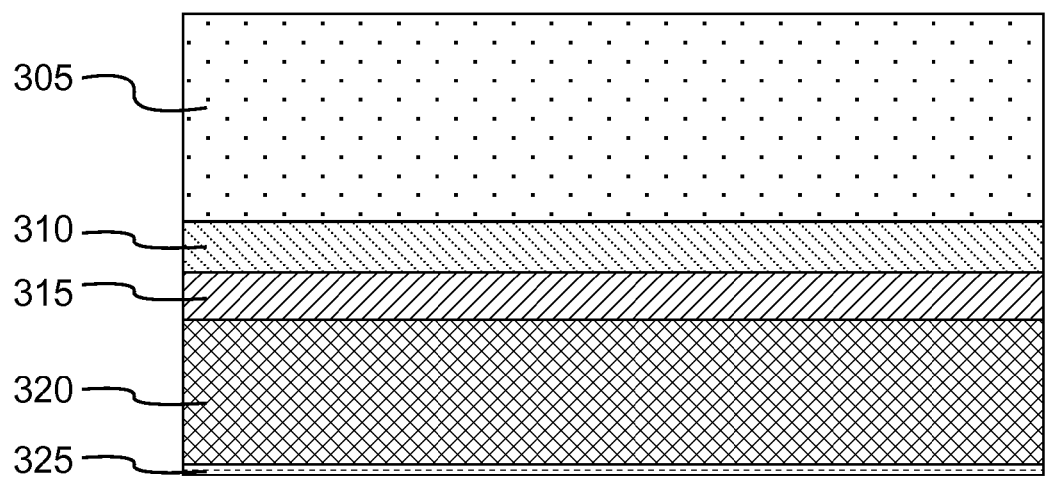
FIG. 3 illustrates an exemplary thermophotovoltaic emitter.

FIG. 3 illustrates an exemplary TPV emitter 300. Emitter 300 is similar to emitter 215 shown in FIG. 2 while showing a more detailed view of a metal mesh discussed above with respect to FIG. 2. In one embodiment, emitter 300 is implemented with a rare earth element oxide layer 305, which is disposed on a high density rare earth element oxide layer that includes low density metal particles 310, which is in turn disposed on a low density rare earth element oxide layer that includes high density metal particles 315, which is in turn disposed on a metal mesh 320, which in turn is disposed on a reflective layer 325. As shown in FIG. 3, reflective layer 325 may be implemented as a thin film of platinum that serves as a barrier to oxidation for other metals implemented in emitter 300 while at the same time rejecting radiation composed of long undesirable wavelengths. At approximately 1500° C., the peak spectral emission of the radiation from combustor 210 is upconverted by the selective rare earth element oxide emitter 300 to light in the range of 800 nm to 1000 nm.

Refractory metal mesh 320 may be made of, for example, Molybdenum (Mo) with a substantially high density. In one specific embodiment, low density rare earth element oxide layer 315 may be implemented as, for example, 75% Molybdenum (Mo)/25% Ytterbia, while medium density rare earth element metal oxide layer 310 may be implemented as 50% Molybdenum (Mo)/50% Ytterbia. Finally, high density rare earth element oxide layer 305 may transition from 25% Molybdenum (Mo)/75% Ytterbia to 100% Ytterbia. While the precise mixture of elements for various layers is exemplary, the overarching principle of emitter 300 is that a metal mesh is covered in layers of metal (ideally the same metal as the mesh) and mixed rare earth element oxides such that a compositional gradient is formed through the various layers. Simply put, emitter 300 transitions from the metal mesh through various layers of metal/rare earth element oxide compositions to a final layer of substantially pure rare earth element oxide (i.e., emitter 300 transitions from a Molybdenum (Mo) mesh to various layers of mixed Molybdenum (Mo)/Ytterbia to a final layer of substantially pure Ytterbia). Of course, any rare earth element oxide and refractory metal mixture may be implemented, as discussed above with respect to FIG. 2.

Forming emitter 300 as a series of rare earth element oxide layers on a metallic mesh allows each layer to expand and contract evenly without thermal stresses as emitter 300 is exposed to heat and is cooled. In other words, the coefficient of thermal expansion for emitter 300 is gradually graded from relatively low values (~5 ppm/° C.) at the refractory metal mesh 320 to high values (~12 ppm/° C.) representative of rare earth element oxide layer 305. This prevents cracking of emitter 300 during the rapid heating and cooling by the relatively high temperatures of combustor 210, shown in FIG. 2. Emitter 300 may be fashioned using powder metallurgy techniques such as spark plasma sintering or thin film processes such as PVD (Physical Vapor Deposition) sputtering. PVD sputtering deposits thin layers of metal on a substrate. Rare earth oxides may be deposited on the thin layers of metal using atomic layer deposition. Further, as previously mentioned, metal mesh layer 320 may be substituted by metal foil or photonic crystals. Photonic crystals suitable to replace metal mesh layer 320 are generally composed of refractory metals which are etched or otherwise formed into patterns that "tune" the emission characteristics of emitter 300 to emit light with shorter wavelengths into one or more photovoltaic cells, such as the one or more photovoltaic cells 220, and as discussed above with respect to FIG. 2.

Figure 4:
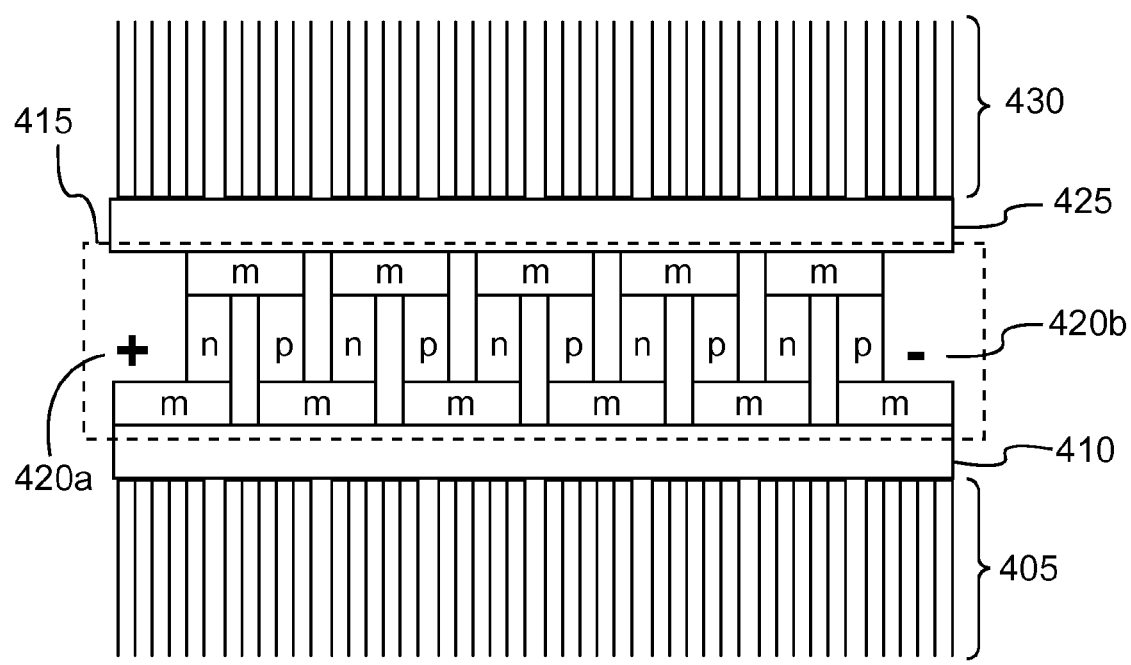
FIG. 4 illustrates a thermoelectric generator of a propulsion power system.

FIG. 4 illustrates a thermoelectric generator 400 ("TEG 400") used in a propulsion power system. As discussed above with respect to FIG. 1, flue gases are exhausted from combustor 120 into TEG 110, which is similar to TEG 400. Accordingly, TEG 400 includes a heat exchanger 405 that extracts heat from the flue gases exhausted from, for example, combustor 120 shown in FIG. 1. TEG 400 converts this heat into electricity through the use of thermoelectric couples 415, which are disposed between a hot ceramic layer 410 and a cold ceramic layer 425.

Thermoelectric couples 415 are configured as pairs of N-type and P-type thermoelectric legs in an electrically series, thermally parallel configuration Thermoelectric couples 415 generate a voltage across a load resistor when subjected to a temperature gradient, as per the Seebeck effect. The N-type and P-type thermoelectric legs in the TEG 400 are based on high temperature semiconductors that have high Seebeck coefficient S, high electrical conductivity a and low thermal conductivity $\lambda$. These characteristics result in a high thermoelectric figure of merit, referred to as ZT. $ZT=\sigma S^2 T/\lambda$, where temperature T is the average temperature across the thermoelectric leg. N-type thermoelectric legs may be implemented as skutterudite materials such as Yb—Ba—Co—Sb systems (Ytterbium, Barium, Cobalt, Antimony); lead chalcogenide systems such as Pb—Te (Lead-Tellurium) and Pb—Se (Lead-Selenium); half-heusler compositions such as Hf—Ni—Sn—Sb systems (Halfium, Nickel, Tin, Antimony); rare earth tellurides such as La—Te systems (Lanthanum-Tellurium); or semiconductors such as Indium Antimonide (InSb); and Silicon (Si) and Phosphorus (P) doped Silicon-Germanium (SiGe) systems. P-type thermoelectric legs may be implemented as skutterudite materials such as Ce—Fe—Co—Sb systems (Cerium, Iron, Cobalt, Antimony); lead chalcogenide systems such as Pb—Te (Lead-Tellurium); half-Heusler compositions such as Zr—Co—Sn—Sb systems (Zirconium, Cobalt, Tin, Antimony); Zintyl compounds such as Yb—Mn—Sb systems (Ytterbium, Manganese, Antimony); semiconductors such as Zn—Sb (Zinc, Antimony); and Boron (B) doped Si—Ge (Silicon, Germanium) systems. These materials may be ball-milled to produced nanostructured grains and compacted using spark plasma sintering or deposited by thin film PVD or Chemical Vapor Deposition (CVD) techniques.

Accordingly, when heat is applied to thermoelectric couples 415, it is transported from the hot side to the cold side by electrons in the N-type legs and the holes in the P-type legs, thereby setting an electrical voltage and current across an external electrical load. The voltage across a load resistor is proportional to the temperature differential across the legs, as per the Seebeck effect. The thermoelectric couples 415 are disposed between hot ceramic layer 410 and cold ceramic layer 425 which may be implemented using materials such as Aluminum Nitride (AlN), Aluminum Oxide ($Al_2O_3$), Silicon Nitride (SiN), or high temperature metal core substrates such as anodized Molybdenum (Mo) and Aluminum (Al). The hot ceramic layer 410 and cold ceramic layer 425 include direct bonded metal tabs (labeled as "m" in FIG. 4) that connect the N-type and P-type thermoelectric legs of the thermoelectric couples 415 in an electrically series, thermally parallel configuration.

Accordingly, electrical current flows within TEG 400 as heat is applied to thermoelectric couples 415. More specifically, DC electricity with a high voltage is produced at terminal 420a while DC electricity with a low or zero voltage is produced at terminal 420b. Thus, DC electricity flows from low voltage at terminal 420 to the higher voltage at terminal 420a. Excess heat captured by heat exchanger 405 that cannot be converted into electricity for efficiency reasons may be conducted into cold ceramic layer 425 and into heat exchanger 430.

Heat exchanger 405 may be implemented using ultrathin carbon steel or refractory metals to absorb as much heat as possible from the flue gases applied to heat exchanger 405. Heat exchanger 405 may be further be implemented as a series of metal fins that allow the heated flue gases to flow along a length of the fins. Providing heat exchanger 405 with a series of metal fins increases the surface area of heat exchanger 405 to allow as much heat as possible to be absorbed into heat exchanger 405 from the exhausted flue gases. Heat exchanger 405 may be fabricated using lightweight Silicon Carbide (SiC) or Silicon (Si) materials while heat exchanger 430 may be fabricated from light weight extruded aluminum (Al) or graphite heat sinks.

Heat exchanger 430 may further include a series of metal fins that allow cool air to flow along the length and height of the fins. Providing heat exchanger 430 with a series of metal fins increases the surface area of heat exchanger 430 to allow as much excess heat as possible to be dissipated into the ambient air. Thus, as a UAV using the hybrid propulsion system of claim 1 flies, hot flue gases are exhausted into heat exchanger 405 to produce electricity while any excess heat is dissipated into the ambient air by heat exchanger 430 as the UAV flies.

Figure 5:
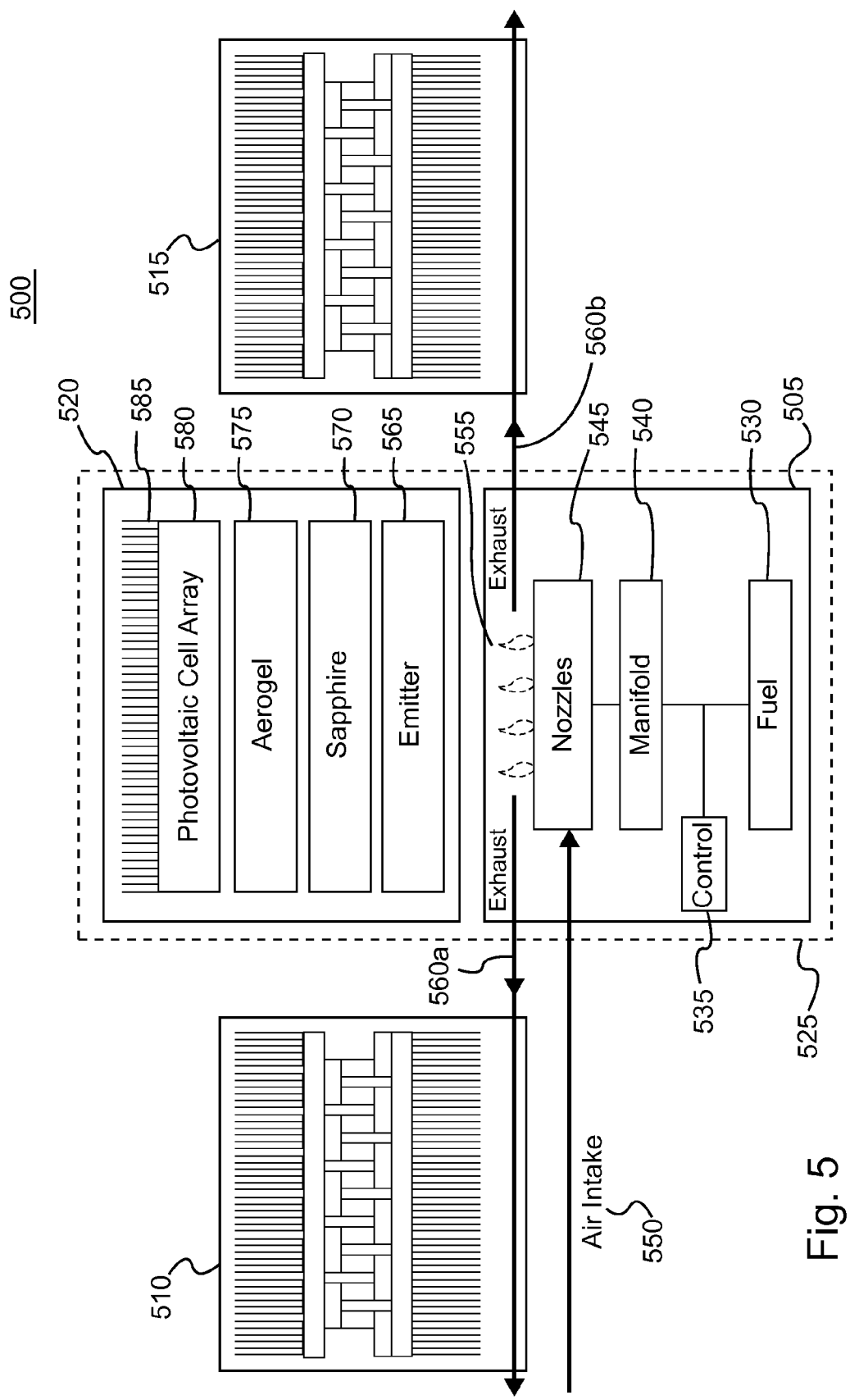
FIG. 5 illustrates one embodiment of a thermoelectrophotovoltaic hybrid solid-state propulsion power system.

FIG. 5 illustrates one embodiment of a thermoelectrophotovoltaic hybrid solid-state propulsion power system 500 for a UAV. Thermoelectrophotovoltaic hybrid propulsion power system 500 comprises a combustor 505, a TEG 510, an optional TEG 515, and TPV 520. In this embodiment TEG 510 and TEG 515 are shown merely for purposes of description. Thermoelectrophotovoltaic hybrid propulsion power system 500 may include a single TEG or may include multiple TEGs depending on any particular desired implementation of thermoelectrophotovoltaic hybrid propulsion power system 500. In this embodiment, combustor 505 and TPV 520 are situated with TEG 510 and TEG 515 to form thermoelectrophotovoltaic module 525. Thermoelectrophotovoltaic module 525 is configured to allow flue gases to be exhausted from combustor 505 into heat exchangers in any TEG included in thermoelectrophotovoltaic hybrid propulsion power system 500, including TEG 510 and TEG 515.

Combustor 505 includes a relatively lightweight pressurized fuel tank 530. Fuel tank 530 may contain any chemical based fuel suitable for use with thermoelectrophotovoltaic hybrid propulsion power system 500. For example, chemical based fuels suitable for use with hybrid propulsion power system 105 include natural gas, butane, gasoline, hydrogen, methane, propane, any other liquid or gaseous hydrocarbon, carbon monoxide, ethanol, kerosene, and any mixture or combination of these fuels in any proportion. Combustor 505 further includes a control mechanism 535 to selectively release fuel from fuel tank 530 into a manifold 540 that directs the fuel into one or more nozzles 545. Control mechanism 535 controls the amount of fuel released from fuel tank 530 as a function of time. For example, control mechanism 535 may selectively release substantially more fuel into manifold 540 during periods of take-off for a UAV or may selectively release substantially less fuel into manifold 540 during periods of sustained flight or landing for the UAV. Regardless, manifold 540 is configured to act as a fuel duct, carrying fuel from fuel tank 530 to nozzles 545. At nozzles 545, the fuel and air drawn into combustor 505 through air intake 550 and are entrained, mixed, or otherwise combined in a mixture that provides for nearly complete combustion of the fuel in flames 555. Flames 555 burn in excess of 1500° C., and potentially up to 2500° C.

As flames 555 burn the mixture of fuel and air, exhaust is produced as the result of combustion. In the embodiment of thermoelectrophotovoltaic hybrid propulsion power system 500, two exhaust ducts 560a and 560b are provided that exhaust the gases resulting from combustion of the fuel/air mixture, also known as flue gases. Exhaust duct 560a is provided to direct flue gases into TEG 510 while exhaust duct 560b is provided to direct flue gases into TEG 515. As mentioned previously, thermoelectrophotovoltaic hybrid propulsion power system 500 may include any number of TEGs. Accordingly, any number of exhaust ducts may also be provided to carry flue gases to a corresponding TEG implemented within system thermoelectrophotovoltaic hybrid propulsion power system 500. In other words, for every TEG in thermoelectrophotovoltaic hybrid propulsion power system 500, thermoelectrophotovoltaic hybrid propulsion power system 500 will include a corresponding exhaust duct.

TEG 510 and TEG 515 operate in a manner similar to that discussed above with respect to FIG. 4. Simply put, for purposes of complete explanation, flue gases exhausted through exhaust duct 560a or 560b heat a heat exchanger contained in each of TEG 510 and TEG 515. The heat is conducted to a series of N-Type and P-type thermoelectric couples, similar to thermoelectric couples 415 shown in FIG. 4 and described above, in each of TEG 510 and TEG 515 which convert the heat into electricity. Any excess heat may be directed into a second heat exchanger contained in each of TEG 510 and TEG 515 and dissipated into surrounding air. Alternatively, heat that is not absorbed by TEG 510 or TEG 515 may be directed back into the air intake to pre-heat the air for combustor 505. Electricity generated by TEG 510 and 515 may be conducted to electrical components of a UAV, such as electrical motors, batteries, DC-DC converters, or any other electrical component of a UAV.

In addition to heat, flames 555 also produce radiation into TPV 520 to create electricity in addition to electricity that is generated by TEG 510 and TEG 515, as discussed above with respect to FIG. 2 and FIG. 3. TPV 520 includes an emitter 565 which is constructed using a rare earth element oxide, such as Ytterbia, which is disposed on a metal mesh, metal foil, or photonic crystals, which is further disposed on a reflector that may be sputtered with a layer of Platinum (Pt). The platinum layer within emitter 565, reflects radiation with a longer wavelength back into flames 555. At the same time, wavelengths of light between 800 nm and 1000 nm are emitted by emitter 565 in a process called frequency upconversion, discussed above, into photovoltaic cell array 580. However, because the heat produced by flames 555 is intense, two layers of insulation are provided to prevent photovoltaic cell array 580 from experiencing heat damage. First, a sapphire wafer 570 is provided as a first insulator. Second, an optically transparent silica aerogel 575 is provided as a second insulator. Both sapphire wafer 570 and silica aerogel 575 allow light to pass through without impediment while deflecting heat from photovoltaic cell array 580. In another embodiment, the first insulator can be made of quartz wafer and the second insulator can be made of transparent titania aerogel or transparent zirconia aerogel. Accordingly, desirable wavelengths of light emitted by emitter 565 are projected into photovoltaic cell array 580 while preventing intense heat generated by flames 555 from damaging photovoltaic cell array 580. Photovoltaic cell array 580 converts the light energy received from emitter 565 into electricity, which may be conducted to other electrical components of a UAV, such as electrical motors, batteries, DC-DC converters, or any other electrical component of a UAV. However, as photovoltaic cell array 580 generates electricity, heat is generated. In order to further protect photovoltaic cell array 580 from heating, a heat sink 585 may be provided within TPV 520. Heat sink 585 may be constructed in a manner similar to other heat sinks disclosed herein, such as heat sinks used in connection with TEG 510, TEG 515, or as described with respect to TEG 400 shown in FIG. 4. Accordingly, as ambient air passes over fins disposed within heat sink 585, heat is drawn away from photovoltaic cell array 580 and is dissipated in ambient air as a UAV flies.

Accordingly, electrical power that is used to power motors of propellers associated with a UAV is generated by all of TEG 510, TEG 515, and TPV 520 simultaneously as a product of heat and radiation generated by combustor 505. The electrical power generated by TEG 510, TEG 515, and TPV 520 may be provided to a DC-DC converter, batteries, motors, or any other electrical component in a UAV. This configuration results in substantial increases in the overall efficiency of a UAV that implements this configuration when compared with conventional battery powered UAVs.

For example, the efficiency of thermoelectrophotovoltaic hybrid propulsion power system 500 may be calculated by determining the efficiencies of any TEG or TPV included in thermoelectrophotovoltaic hybrid propulsion power system 500. In one embodiment, the efficiency of the TPV 520 may be calculated as the product of the efficiency of emitter 565 and the efficiency of photovoltaic cell array 580. In most embodiments, depending on the particular photovoltaic cell array 580 that is implemented within thermoelectrophotovoltaic hybrid propulsion power system 500, expected efficiency will be approximately 17%. The efficiency of TEG 510 or TEG 515 is a function of the temperature of the gasses exhausted into TEG 510 or TEG 515. However, for optimal electrical loads and operating temperatures between $T_h$ and $T_c$, the efficiency of TEG 510 or TEG 515 ($\epsilon$TEG) may be described by the following equation:

$$\varepsilon_{TEG} = \left(\frac{T_h - T_c}{T_h}\right) \cdot \left[\frac{\sqrt{1 + \frac{Z(T_h + T_c)}{2}} - 1}{\sqrt{1 + \frac{Z(T_h + T_c)}{2}} + \frac{T_c}{T_h}}\right]$$

For $T_h$ at approximately 600° C. and $T_c$ at approximately 200° C. and a ZT (the thermoelectric figure of merit) of 1, maximum efficiency of a TEG 510 or TEG 515 is approximately 10%. For $T_h$ at 1000° C. and $T_c$ at approximately 500° C. and a ZT (the thermoelectric figure of merit) of 1, maximum efficiency of a TEG 510 or TEG 515 is approximately 16%. However, because of inefficiencies in the flue gas heat exchanger, an efficiency of approximately 10% is more likely in real world applications.

Accordingly, the efficiency of thermoelectrophotovoltaic hybrid propulsion power system 500 may be derived by adding the efficiency of TPV 520 with the efficiency of TEG 510 or 515, which results in approximately 27% efficiency. Even in real world applications, the overall system efficiency for thermoelectrophotovoltaic hybrid solid-state propulsion power system 500 exceeds 20%.

In case of chemical fuel such as butane with specific energy of 12.5 kWh/kg, the implementation of the thermoelectrophotovoltaic hybrid solid-state propulsion power system 500 can result in system specific energy exceeding 5 kWh/kg that is 25 times better than the efficiency of advanced lithium-polymer (LiPo) batteries. Accounting for mass of the butane tanks, the thermoelectrophotovoltaic hybrid solid-state propulsion system 500 can result in more than 8 times the specific energy of conventional lithium based batteries in UAV applications, while providing a payload capacity 4-6 times greater than conventional battery powered UAVs.

The foregoing description has been presented for purposes of illustration. It is not exhaustive and does not limit the invention to the precise forms or embodiments disclosed. Modifications and adaptations will be apparent to those skilled in the art from consideration of the specification and practice of the disclosed embodiments. For example, components described herein may be removed and other components added without departing from the scope or spirit of the embodiments disclosed herein or the appended claims.

Other embodiments will be apparent to those skilled in the art from consideration of the specification and practice of the disclosure disclosed herein. It is intended that the specification and examples be considered as exemplary only, with a true scope and spirit of the invention being indicated by the following claims.

What is claimed is:

1. A propulsion system for an aerial vehicle, the aerial vehicle comprising:
    a combustor configured to combust air and a fuel thereby generating exhaust gases and electromagnetic radiation;
    an emitter configured to receive the electromagnetic radiation, the emitter configured to reflect infrared radiation with a wavelength greater than 1500 nm into the combustor, the emitter further configured to emit only radiation with a wavelength between 500 nm and 1500 nm to at least one photovoltaic cell, wherein the at least one photovoltaic cell generates electrical power for an electric motor that drives a propeller to propel the aerial vehicle;
    an exhaust duct to flow the exhaust gases from the combustor to a thermoelectric generator, wherein the thermoelectric generator generates electrical power for the electric motor.

2. The propulsion system of claim 1, wherein the emitter includes a first layer containing platinum, a metal mesh, and a second layer containing a rare earth oxide.

3. The propulsion system of claim 1, wherein the emitter includes a first layer containing platinum, a metal foil, and a second layer containing a rare earth oxide.

4. The propulsion system of claim 1, wherein the emitter includes a first layer containing platinum, a photonic crystal, and a second layer containing a rare earth oxide.

5. The propulsion system of claim 1, further comprising:
    a first insulator disposed between the combustor and the at least one photovoltaic cell.

6. The propulsion system of claim 5, further comprising:
    a second insulator disposed between the combustor and the at least one photovoltaic cell.

7. The propulsion system of claim 6, wherein the first insulator is one of a sapphire wafer and a quartz wafer and the second insulator is one of a titania aerogel, a zirconia aerogel, or a silica based aerogel.

8. The propulsion system of claim 1, wherein the thermoelectric generator includes a heat exchanger that absorbs heat from the exhaust gases.

9. The propulsion system of claim 8, wherein the thermoelectric generator includes at least one N-type thermoelectric leg and at least one P-type thermoelectric leg connected in a series electrical connection.

10. The propulsion system of claim 1, further comprising:
    a DC-DC converter.

11. The propulsion system of claim 10, wherein the thermoelectric generator and the at least one photovoltaic cell are electrically connected to the DC-DC converter.

* * * * *